(12) United States Patent
Higuchi

(10) Patent No.: US 9,421,628 B2
(45) Date of Patent: Aug. 23, 2016

(54) METHOD OF MANUFACTURING PRINTED CIRCUIT BOARD AND PRINTED CIRCUIT BOARD

(71) Applicant: CANON KABUSHIKI KAISHA, Tokyo (JP)

(72) Inventor: Satoru Higuchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 8 days.

(21) Appl. No.: 14/565,167

(22) Filed: Dec. 9, 2014

(65) Prior Publication Data

US 2015/0173189 A1     Jun. 18, 2015

(30) Foreign Application Priority Data

Dec. 17, 2013    (JP) .................. 2013-260254

(51) Int. Cl.
*H01L 23/48*     (2006.01)
*B23K 1/00*      (2006.01)
*H01L 23/00*     (2006.01)
*H05K 3/34*      (2006.01)

(52) U.S. Cl.
CPC .............. *B23K 1/0016* (2013.01); *H01L 24/00* (2013.01); *H01L 24/11* (2013.01); *H05K 3/3452* (2013.01); *B23K 2001/12* (2013.01); *B23K 2201/42* (2013.01); *H01L 2224/0401* (2013.01); *H01L 2224/11849* (2013.01); *H01L 2224/81815* (2013.01); *H05K 3/3436* (2013.01); *H05K 2201/099* (2013.01); *H05K 2201/0989* (2013.01); *H05K 2201/10719* (2013.01)

(58) Field of Classification Search
CPC ..................... H01L 24/11; H01L 2224/81815; H01L 2224/0401; H01L 2224/11849
USPC .................................. 257/778, 779
See application file for complete search history.

(56) References Cited

U.S. PATENT DOCUMENTS 7,719,101 B2 *   5/2010   Dangelmaier et al. ........ 257/693

FOREIGN PATENT DOCUMENTS

JP         2004-055827 A      2/2004

* cited by examiner

*Primary Examiner* — Howard Weiss
*Assistant Examiner* — Tifney Skyles
(74) *Attorney, Agent, or Firm* — Fitzpatrick, Cella, Harper & Scinto

(57) ABSTRACT

A method of manufacturing a printed circuit board includes: supplying solder paste so as to be offset from an electrode pad of a printed wiring board; flowing the solder paste during melting; and forming a region that is not covered with solder resist on the outer peripheral region adjacent to the electrode pad of the printed wiring board to which solder paste is supplied, thereby increasing a gap between a semiconductor package and the printed wiring board to prevent separation of the solder.

10 Claims, 12 Drawing Sheets

METHOD OF MANUFACTURING PRINTED CIRCUIT BOARD AND PRINTED CIRCUIT BOARD

BACKGROUND OF THE INVENTION

1. Field of the Invention

The present invention relates to a method for inhibiting a void caused in a junction when a printed circuit board is manufactured, and to a structure of the printed circuit board.

2. Description of the Related Art

In recent years, as electronic equipment become miniaturized, a printed circuit board to be incorporated therein is required to be more miniaturized and thinner. In order to realize such miniaturization, miniaturizing and thinning of a semiconductor package to be mounted on a printed wiring board are pursued. As a semiconductor package that can realize both miniaturization and higher functionality, a ball grid array (BGA), a chip size package (CSP), or a land grid array (LGA) is used in which a plurality of connection terminals can be arranged on a lower surface of the semiconductor package.

When such a semiconductor package is mounted on a printed wiring board, by heating and melting solder paste in a reflow furnace, an electrode pad of the semiconductor package and an electrode pad of the printed wiring board are joined to each other. In general, solder paste contains flux, which has the function of removing a surface oxide film of a solder particle and adjusting viscosity thereof. However, when solder paste is heated, there is a problem in that a solvent and an activator contained in the flux are gasified to leave a void in a solidified solder junction.

In a manufacturing method disclosed in Japanese Patent Application Laid-Open No. 2004-55827, first, as illustrated in FIG. 12A, solder paste 8 is supplied to an electrode pad 4 provided on a printed wiring board 101. The manufacturing method has a feature in that, in this step, the solder paste 8 is supplied to a position offset from the electrode pad 4. Specifically, the solder paste 8 is supplied so as to extend both on the electrode pad 4 and on a solder resist 11.

As a related art for reducing a void caused in the junction, in Japanese Patent Application Laid-Open No. 2004-55827, there is proposed a manufacturing method involving connecting pin-like connection terminals to a printed wiring board.

The printed wiring board used in Japanese Patent Application Laid-Open No. 2004-55827 has a structure in which, as illustrated in FIG. 12A, the electrode pad 4 is formed on a surface of the printed wiring board 101 and an outer edge portion of the electrode pad 4 is covered with the solder resist 11. As the electrode pad 4, copper that has good wettability with the solder serving as a joining material and exhibits good conductivity is used. On the other hand, as the solder resist 11, a resin that has poor wettability with the solder and has insulation properties is used.

Then, as illustrated in FIG. 12B, a pin-like terminal component 100 is mounted so as to be aligned with the electrode pad 4 on the printed wiring board 101. The connection terminal provided on a lower portion of the pin-like terminal component 100 has the same size as that of the electrode pad 4. Therefore, in a step of mounting the pin-like terminal component 100, the solder paste 8 supplied onto the electrode pad 4 is pressed by the pin-like terminal component 100, but a portion of the solder paste 8 that is supplied so as to be offset from the electrode pad 4 is not pressed.

Then, as illustrated in FIG. 12C, by heating and melting the solder with a furnace, the pin-like terminal component 100 and the printed wiring board 101 are joined to each other. In this step, the portion of the solder paste 8 that is supplied so as to be offset from the electrode pad 4 agglomerates as one mass, when molten by heat, and moves so as to spread on the entire electrode pad 4. When the flux in the solder paste 8 removes a surface oxide film of the electrode pad 4, gas is generated. However, the movement of the molten solder forces the gas out of the solder. By solidifying the molten solder through cooling under a state in which the gas is forced out, a void caused in a solder junction 10 can be reduced as illustrated in FIG. 12D.

In recent years, because a solder ball is not formed on the electrode pad, an LGA is adopted when a thinner semiconductor package is required or when repeated heat application is not permitted in mounting as in the case of a CCD or a CMOS. When the LGA is mounted, a gap between the semiconductor package and the printed wiring board is small. Therefore, an area of the solder junction exposed to outside air is small and the generated gas is less likely to escape to the outside, and thus, a large void is more liable to be caused. When a void is caused in the solder junction, a junction area joined by the solder becomes smaller to lower joining reliability. As a joint pitch becomes smaller and as the junction becomes smaller as in recent years, the lowered reliability due to the void becomes a severe problem.

The above-mentioned manufacturing method disclosed in Japanese Patent Application Laid-Open No. 2004-55827 has been proposed for the purpose of reducing a void caused in a junction between a pin-like connection terminal for a pin grid array (PGA) package and an electrode pad. Therefore, when the related art is applied to a case in which not a pin-like connection terminal but a semiconductor package such as an LGA is joined to a printed wiring board, a phenomenon occurs in which solder supplied so as to be offset cannot move to a connection terminal of the printed wiring board and is separated.

When the molten solder is separated and moves between electrode pads, adjacent electrode pads may be connected to each other to cause a short circuit failure. Further, the separation of the solder reduces a volume of solder that remains on the electrode pad to lower the joining reliability. Further, when the gap between the semiconductor package and the printed wiring board is small, the flux contained in the solder paste may extend beyond the electrode pad due to capillary action. When the flux remains between adjacent electrode pads as a residue, another problem arises in that an insulation resistance between the adjacent electrode pads is lowered under the influence of the activator in the flux.

SUMMARY OF THE INVENTION

It is an object of the present invention to provide a method of manufacturing a printed circuit board and the printed circuit board, which are capable of, when a semiconductor package and a printed wiring board are joined to each other, reducing a void caused in a junction and securing insulating reliability without separating solder.

According to one embodiment of the present invention, there is provided a method of manufacturing a printed circuit board, the printed circuit board including: a first printed wiring board including a first electrode pad formed on a surface thereof; and a second printed wiring board including a second electrode pad formed on a surface thereof, the first electrode pad and the second electrode pad being joined with solder, the method including: forming, on the second printed wiring board: a first region in an outer edge portion of the second electrode pad, which is covered with solder resist; a second region on the second electrode pad, which is prevented from being covered with the solder resist; and a third region in an outer peripheral region of the second electrode pad adjacent to the second region, which is prevented from being covered with the solder resist; and joining the first electrode pad and the second electrode pad to each other by: supplying solder paste onto a region extending over the second region and the third region; mounting the first printed wiring board on the second printed wiring board so that the first electrode pad of the first printed wiring board is opposed to the second electrode pad of the second printed wiring board; heating the solder paste to be molten; and causing the molten solder to move from the third region toward the second region.

Further, according to one embodiment of the present invention, there is provided a printed circuit board, including: a first printed wiring board including a first electrode pad formed on a surface thereof; and a second printed wiring board including a second electrode pad formed on a surface thereof, the first electrode pad and the second electrode pad being joined with solder, in which the second printed wiring board includes: a first region in an outer edge portion of the second electrode pad, which is covered with solder resist; a second region on the second electrode pad, which is prevented from being covered with the solder resist; and a third region in an outer peripheral region of the second electrode pad adjacent to the second region, which is prevented from being covered with the solder resist.

According to the method of manufacturing a printed circuit board of one embodiment of the present invention, the solder paste serving as a joining material is supplied to a position offset from the electrode pad formed on the printed wiring board. Further, in the region offset from the electrode pad in the supply position of the solder paste, a surface of the printed wiring board is not covered with the solder resist, and thus, the region is lower than the electrode pad. Specifically, when the semiconductor package is mounted on the printed wiring board, the solder paste on the electrode pad is sandwiched between the printed wiring board and the semiconductor package, but the solder paste supplied so as to be offset from the electrode pad is not pressed as compared with that of the solder paste on the electrode pad. Therefore, when the solder is molten by heat, the solder supplied so as to be offset can agglomerate without being separated to move toward the electrode pad.

The movement of the molten solder toward the electrode pad forces out a void caused in a junction, and thus, an effect of reducing a void caused in the junction can be obtained.

Further, in the region in which the solder paste is supplied so as to be offset from the electrode pad, the surface of the printed wiring board is not covered with the solder resist, and thus, space is formed due to the thickness of the solder resist. When the semiconductor package and the printed wiring board are joined to each other, the solder paste is supplied to the space, and a residual component of the flux accumulates after reflow heating.

It is known that, in general, when a residual component of flux extends between electrode pads, an insulation resistance therebetween is lowered. However, the accumulation of the residual component of the flux in the space described above can inhibit expansion of the residual component of the flux to other regions, and thus, high insulating reliability can be obtained.

Further features of the present invention will become apparent from the following description of exemplary embodiments with reference to the attached drawings.

BRIEF DESCRIPTION OF THE DRAWINGS

FIG. 1A is a top perspective view of the solder junction, and FIG. 1B is a sectional view of the solder junctions taken along the line 1B-1B of FIG. 1A.

FIG. 3A is a top view of the electrode pads, and FIG. 3B is a sectional view of the electrode pads taken along the line 3B-3B of FIG. 3A.

DESCRIPTION OF THE EMBODIMENTS

Preferred embodiments of the present invention will now be described in detail in accordance with the accompanying drawings.

First Embodiment

A printed circuit board according to the present invention is described with reference to FIG. 1A and FIG. 1B.

Figure 1A:
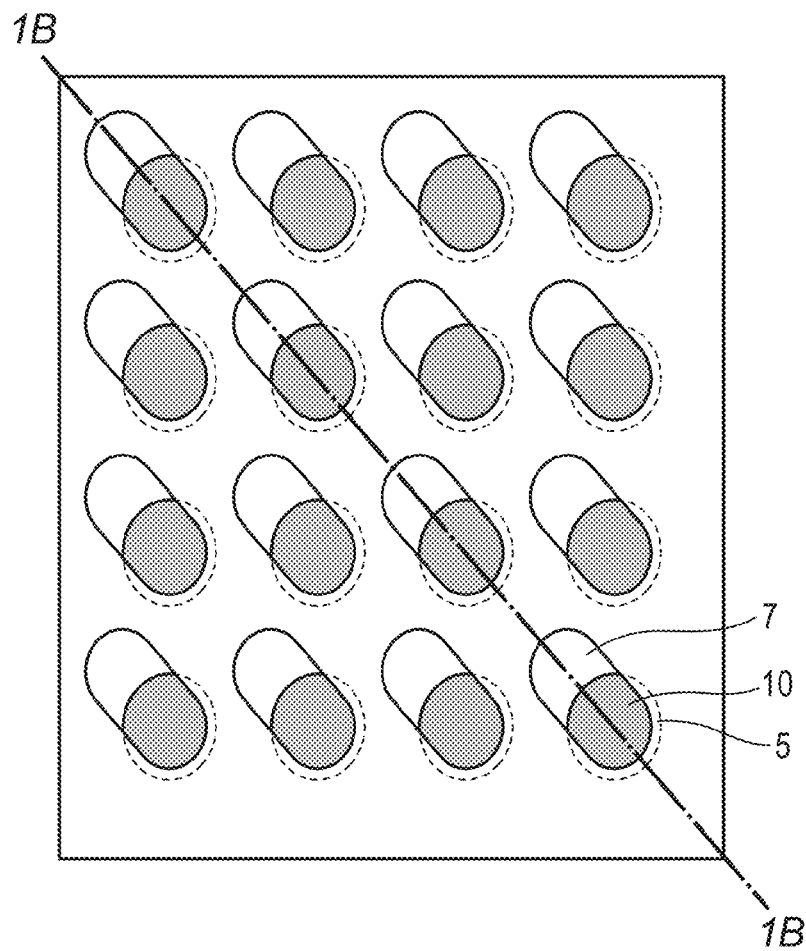
FIGS. 1A and 1B illustrate solder junctions of a printed circuit board according to an embodiment of the present invention.
Figure 1B:
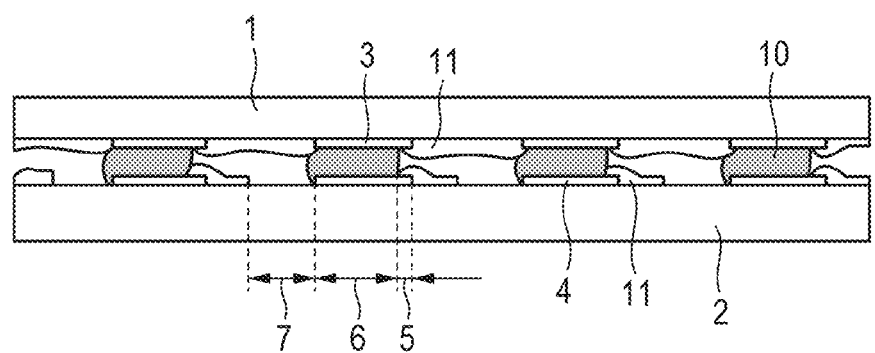

FIG. 1A is a top perspective view of a printed circuit board according to a first embodiment of the present invention, and FIG. 1B is a sectional view of the printed circuit board according to the first embodiment taken along the line 1B-1B of FIG. 1A.

As illustrated in FIG. 1A and FIG. 1B, a surface shape of a semiconductor package 1 includes electrode pads 3 to be joined with solder, and a solder resist 11 that covers outer edge portions of the electrode pads 3. On the other hand, a surface shape of a printed wiring board 2 has first, second, and third regions formed by electrode pads 4 and the solder resist 11. A first region 5 is a region in an outer edge portion of the electrode pad 4 that is covered with the solder resist 11. A second region 6 is a region of a surface of the electrode pad 4 that is not covered with the solder resist 11, and is a place to be connected by the solder. A third region 7 is an outer peripheral region of the electrode pad adjacent to the second region 6, which is not covered with the solder resist 11.

As illustrated in FIG. 1B, the electrode pad 3 of the semiconductor package 1 and the electrode pad 4 of the printed wiring board 2 are formed so as to be vertically opposed to each other.

A solder 10 that connects the semiconductor package 1 and the printed wiring board 2 is connected not only to an upper surface of the electrode pad 4 that is the second region 6 on the printed wiring board 2 but also to a side surface of the electrode pad 4 that is a boundary between the second region 6 and the third region 7. Specifically, in the printed circuit board of the present invention, a joining area of the solder 10 is larger than that in a printed circuit board in which the joining is carried out only on the upper surface of the electrode pad 4, and thus, the joining strength is increased.

Further, the third region 7 is surrounded by the solder resist 11, and has space by an amount of thicknesses of the solder resist 11. A residual component of flux contained in solder paste accumulates in the space.

When the residual component of the flux extends between the electrode pads, an insulation resistance therebetween is lowered. By accumulating most of the residual component of the flux in the third region 7, however, extension of the residual component of the flux to other regions can be inhibited.

Further, when a gap between adjacent electrode pads is small, the third regions may overlap each other. If the solder paste is printed in this state, due to the small gap between solder pastes, there is a high probability that the solder pastes are connected to each other when molten to cause a short circuit failure. Therefore, as illustrated in FIGS. 1A and 1B, by forming the first to third regions in the same direction with respect to all the plurality of electrode pads, the molten solders can be inhibited from being connected to each other. Note that, the same direction as used herein means, when the electrode pad 3 in FIG. 1A is laterally and longitudinally divided into four, being in the same divided region seen from a center of the electrode pad. Further, the direction may be any direction insofar as the direction is in the same divided region and the third region on the outer peripheral portion of an electrode pad 3 does not overlap the first, second, and third regions of adjacent electrode pads 3.

Next, a method of manufacturing the printed circuit board illustrated in FIGS. 1A and 1B is described with reference to FIG. 2A to FIG. 2G.

First, FIGS. 2A to 2D illustrate a step of supplying the solder paste to the printed wiring board by screen printing.

Figure 2A:
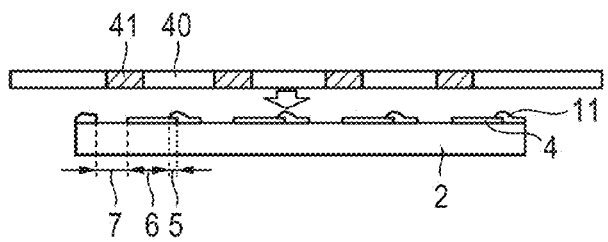
FIGS. 2A, 2B, 2C, 2D, 2E, 2F and 2G are sectional views illustrating a method of manufacturing a printed circuit board according to the embodiment of the present invention.
Figure 2B:
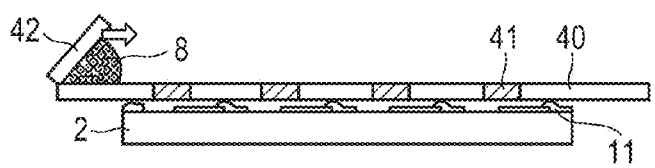
Figure 2C:
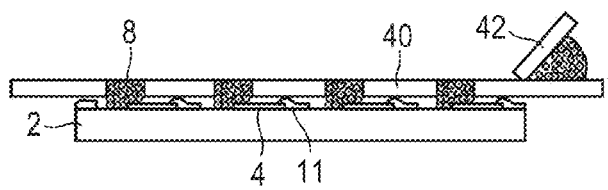
Figure 2D:
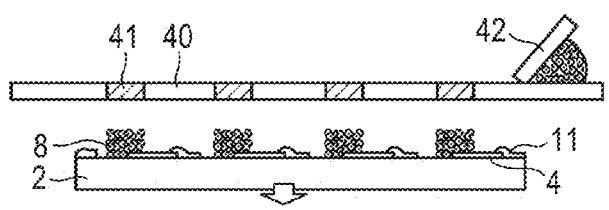

In the step, as illustrated in FIG. 2A, the electrode pads 4 of the printed wiring board 2 and openings 41 of a metal mask 40 are aligned, and, as illustrated in FIG. 2B, the printed wiring board 2 and the metal mask 40 are brought into contact with each other. Then, as illustrated in FIGS. 2B and 2C, solder paste 8 supplied onto an end of the metal mask 40 is filled into the openings of the metal mask 40 by moving a squeegee 42 formed of a urethane or a metal to the other end at a fixed speed. Then, as illustrated in FIG. 2D, by separating the metal mask 40 and the printed wiring board 2 from each other at a fixed speed, the solder paste 8 is transferred onto the electrode pads 4 of the printed wiring board 2. The speed at which the metal mask 40 and the printed wiring board 2 are separated from each other is set to be 1 mm/s to 3 mm/s.

Figure 3A:
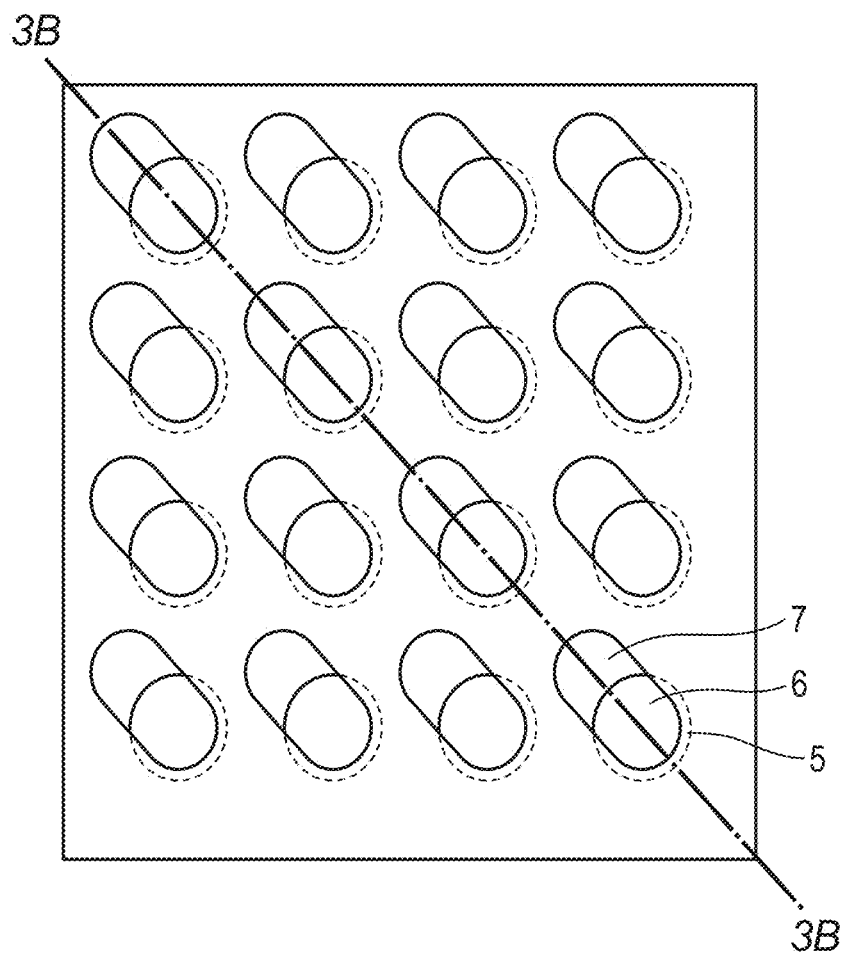
FIGS. 3A and 3B illustrate electrode pads of a printed wiring board according to the embodiment of the present invention.
Figure 3B:
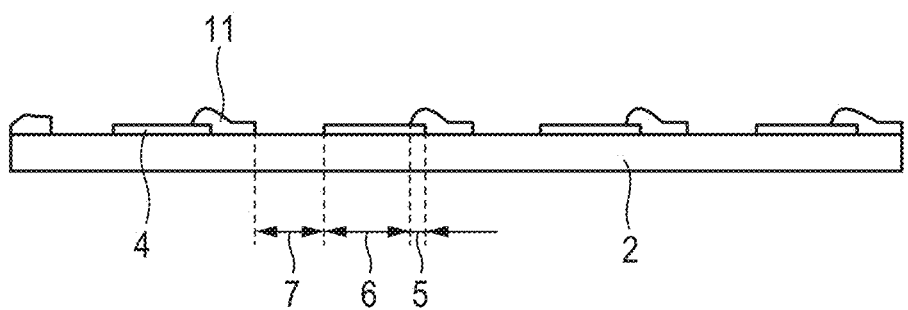

FIGS. 3A and 3B illustrate a printed wiring board to be used in the method of manufacturing a printed circuit board according to the present invention. FIG. 3A is a top view of the printed wiring board, and FIG. 3B is a sectional view of the printed wiring board taken along the line 3B-3B of FIG. 3A. As illustrated in FIGS. 3A and 3B, the first regions 5, the second regions 6, and the third regions 7 are formed on the surface of the printed wiring board 2.

The first region 5 is the region in the outer edge portion of the electrode pad 4 that is covered with the solder resist 11. As illustrated in FIG. 3B, the first region 5 has a total thickness of the thickness of the electrode pad 4 and the thickness of the solder resist 11, and thus, has the largest height on the surface of the printed wiring board 2.

The second region 6 is the region of the surface of the electrode pad 4 that is not covered with the solder resist 11, and is the place to be connected by the solder.

The third region 7 is the outer peripheral region adjacent to the second region 6, which is not covered with the solder resist 11, and, as illustrated in FIG. 3B, is lower than the first region and the second region.

With regard to a method of forming the first region, the second region, and the third region, the regions are formed by etching performed after a liquid resist is applied when a conductive layer patterned on a surface layer of the printed wiring board is covered with the solder resist. Alternatively, a film-like resist material in which openings are formed in advance may be laminated.

The electrode pads of the printed wiring board are provided at positions opposed to the electrode pads of the semiconductor package, respectively. Further, it is often the case that the electrode pad of the printed wiring board have the same size as that of the semiconductor package, but, in some cases, have a different size. Further, there are cases in which, in order to enhance connection reliability, part of the electrode pads are enlarged for the purpose of reinforcement. Note that, with regard to a kind of the printed wiring board, a glass epoxy substrate is typically used, but, other than this, a paper phenol substrate and a ceramic substrate are known.

The metal mask is formed of stainless steel having a thickness of from 50 μm to 150 μm, and the openings are formed by laser processing. A metal mask of nickel formed by an additive method may be used. In screen printing, an amount and positions of the solder paste to be supplied onto the printed wiring board depend on the size and positions of the openings in the metal mask.

As illustrated in FIGS. 2B to 2D, it is necessary that the opening 41 in the metal mask 40 be provided so as to extend both in the second region 6 and in the third region 7 on the printed wiring board and so as to supply the solder paste 8 into a range including the second region 6 and the third region 7. It is typical that the size of the opening be the same as that of the electrode pad of the printed wiring board, but, insofar as the above-mentioned conditions are satisfied, the size of the opening may be different from that of the electrode pad. Further, as the supply position of the solder paste becomes farther from the electrode pad and as a region in which the molten solder moves becomes larger, an effect of reducing a void becomes greater.

Figure 2E:
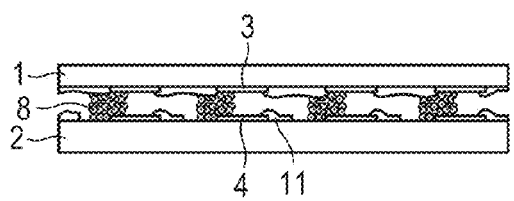
Figure 2F:
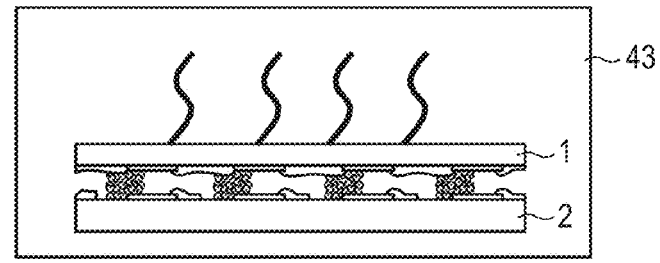

As the next step, as illustrated in FIGS. 2E to 2F, the semiconductor package 1 is mounted on the printed wiring board 2 under a state in which the electrode pads 3 of the semiconductor package 1 are aligned with the opposing electrode pads 4 of the printed wiring board 2, respectively. In mounting, in order to enhance tack power between the solder paste 8 and the semiconductor package 1, it is necessary to press the semiconductor package 1 against the solder paste 8.

Then, as illustrated in FIG. 2F, the printed wiring board 2 having the semiconductor package 1 mounted thereon is heated in a reflow furnace to melt the solder. After the molten solder spreads on the electrode pads 3 of the semiconductor package 1 and the electrode pads 4 of the printed wiring board 2, cooling is carried out to solidify the solder, thereby forming a connected state between the semiconductor package 1 and the printed wiring board 2 illustrated in FIG. 2G. Note that, as a method of heating in the reflow furnace, hot air and infrared radiation are mainly used. When an LGA is mounted on the printed wiring board and the reflow heating is carried out, space between the electrode pad of the semiconductor package and the electrode pad of the printed wiring board is 110 µm or less, which is very small.

Figure 4A:
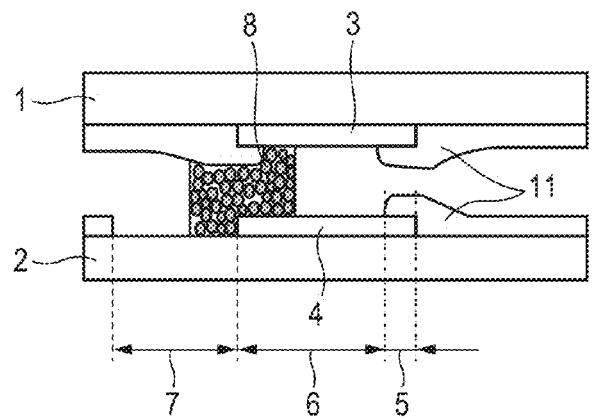
FIGS. 4A, 4B and 4C are sectional views illustrating behavior of solder in a heating step according to the embodiment of the present invention.
Figure 4B:
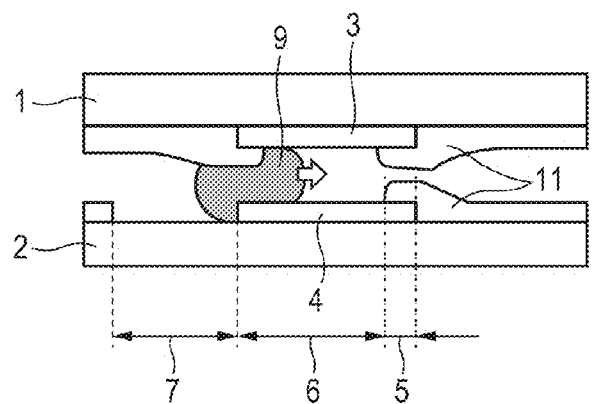
Figure 4C:
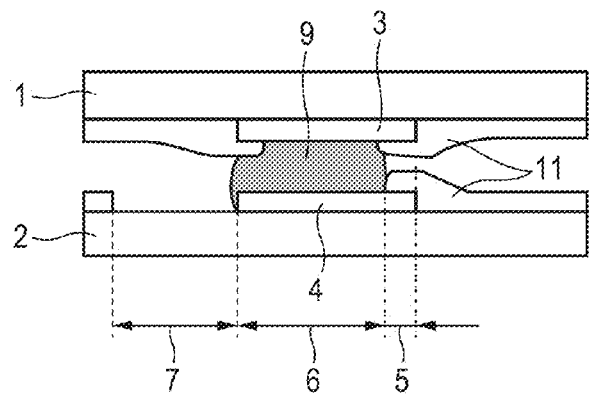

FIGS. 4A to 4C are enlarged sectional views of only one connected place for illustrating behavior of the solder in the heating step illustrated in FIG. 2F.

FIG. 4A illustrates a state before the solder is molten. FIG. 4B illustrates a state in the middle of movement of the solder molten by heat, and FIG. 4C illustrates a state after the movement of the molten solder is completed.

As illustrated in FIG. 4A, the surface shape of the semiconductor package 1 includes the electrode pads 3 to be joined using the solder, and the solder resist 11 that covers the outer edge portions of the electrode pads 3. On the other hand, the surface shape of the printed wiring board 2 has the first, second, and third regions formed by the electrode pads 4 and the solder resist 11.

The first region 5 is the region in the outer edge portion of the electrode pad 4 that is covered with the solder resist 11. The second region 6 is the region of the surface of the electrode pad 4 that is not covered with the solder resist 11, and is the place to be connected by the solder. The third region 7 is the outer peripheral region adjacent to the second region 6, which is not covered with the solder resist 11. The solder paste 8 is supplied to a position that extends both in the second region 6 and in the third region 7. The region to which the solder paste 8 is supplied is surrounded by the solder resist 11, and has space by an amount of the thicknesses of the solder resist.

When solder particles in the solder paste are molten by the heating, as illustrated in FIG. 4B, the molten solder agglomerates as one mass without being separated, and begins to move toward the electrode pad that has good wettability with the solder. Finally, as illustrated in FIG. 4C, the movement of the solder is completed in a state of spreading on the entire electrode pad.

With reference to FIG. 4B, the molten solder can agglomerate without being separated because a structure of the printed wiring board has the third region 7 provided therein at a position to which the solder paste is supplied so as to be offset.

For comparison purposes, a separation phenomenon of the solder in a printed wiring board in which the third region is not provided at the position to which the solder paste is supplied so as to be offset is described with reference to FIGS. 5A to 5C.

Figure 5A:
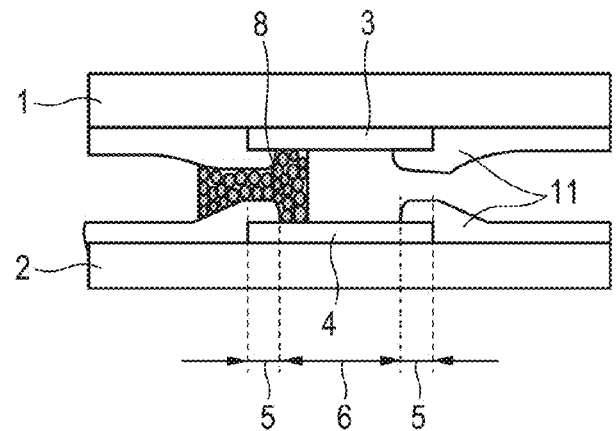
FIGS. 5A, 5B and 5C are sectional views illustrating behavior of solder in a heating step when an ordinary printed wiring board is used.

The printed wiring board 2 illustrated in FIG. 5A has a structure in which the entire outer edge portion of the electrode pad 4 is covered with the solder resist 11. Specifically, only the first region 5 and the second region 6 are formed. Further, the semiconductor package 1 illustrated in FIG. 5A has the same structure as that illustrated in FIG. 4A. The solder paste 8 is supplied to a position offset from the electrode pad 4 of the printed wiring board 2. Specifically, the solder paste 8 is supplied to a position that extends both on the electrode pad 4 and on the solder resist 11.

As illustrated in FIG. 5A, the first region 5 exists in the position to which the solder paste 8 is supplied, and there is not only the thickness of the solder resist 11 but also the thickness of the electrode pads 4. Thus, the gap between the semiconductor package 1 and the printed wiring board 2 is the smallest.

Figure 5B:
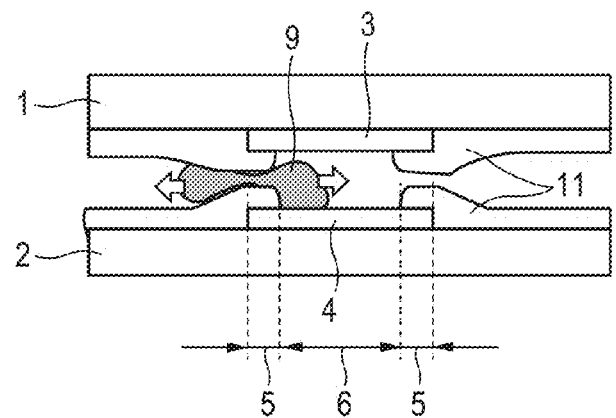
Figure 5C:
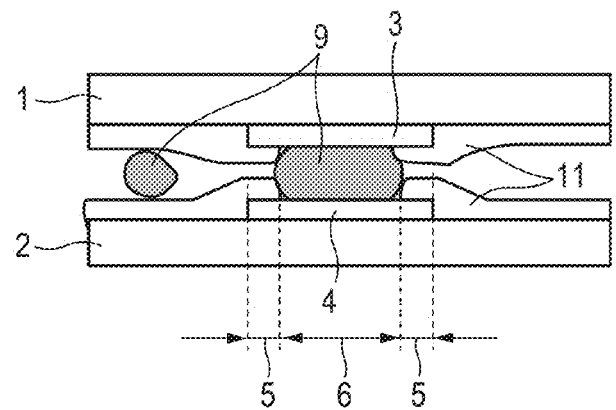

FIG. 5B illustrates a state in which the solder paste is molten by heat. Solder 9 molten by heat is likely to agglomerate by action of surface tension. As illustrated in FIG. 5B, when being sandwiched between the solder resist 11 of the semiconductor package 1 and the solder resist 11 of the printed wiring board 2, the solder 9 is likely to move in two directions. As a result, as illustrated in FIG. 5C, a phenomenon occurs in which part of the molten solder 9 cannot move to the electrode pad 4 to be separated.

Here, experiments for confirming separation occurrence rate of the solder versus a gap between an upper solder resist and a lower solder resist, and results thereof are described. In the experiments, the gap between the upper solder resist and the lower solder resist was changed by changing an amount of the solder supplied, and whether or not solder separation had occurred when the solder was molten was observed with an X-ray transmission apparatus.

A method of changing the amount of the solder supplied was realized by, first, changing the thickness of the metal mask. With regard to Conditions A to C, three kinds of thicknesses of the metal mask (50 µm, 80 µm, and 120 µm) were prepared, and screen printing was performed. With regard to Conditions D to F, the screen printing could supply only an insufficient amount of the solder, and thus, the gap between the solder resists was realized by additionally supplying solder balls.

With regard to a method of supplying the solder balls, after flux was in advance applied to the electrode pads of the semiconductor package having an LGA structure, the solder balls were mounted and heated to connect the solder balls to the electrode pads. Further, with regard to Conditions D to F, a metal mask having a thickness of 120 µm was used and the solder paste was supplied onto the printed wiring board.

The electrode pads formed on the printed wiring board and on the semiconductor package used in the experiments had a thickness of 10 µm. Experiments under the same conditions were carried out twenty times to derive the separation occurrence rate of the solder. With regard to a method of measuring the gap between the electrode pad of the semiconductor package and the electrode pad of the printed wiring board, after the semiconductor package and the printed wiring board were joined to each other, the sample was cut and a section of a solder junction thereof was observed under a microscope, thereby carrying out measurement.

The following Table 1 shows the gap of the solder resist at a place sandwiching the solder, the gap between the electrode pad of the semiconductor package and the electrode pad of the printed wiring board, and the separation occurrence rate of the solder with regard to the respective conditions.

TABLE 1

| Condition | Gap of solder resist at place sandwiching solder (µm) | Gap between electrode pad of semiconductor package and electrode pad of printed wiring board (µm) | | Separation occurrence rate of solder (%) |
|---|---|---|---|---|
| A | 0 | 20 | → | 100 |
| B | 15 | 35 | → | 70 |
| C | 30 | 50 | → | 20 |
| D | 40 | 60 | → | 5 |
| E | 90 | 110 | → | 0 |
| F | 100 | 120 | → | 0 |

Figure 6:
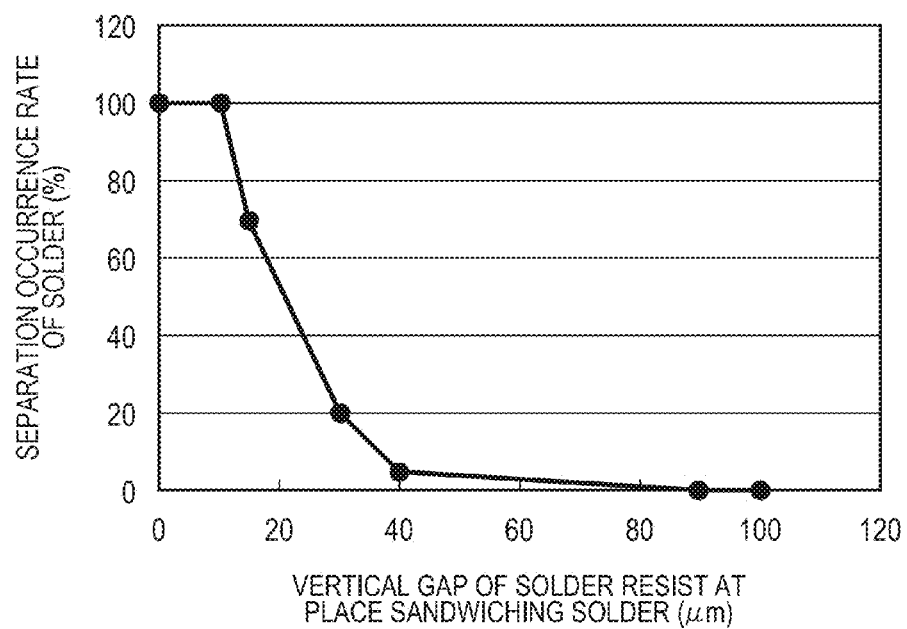
FIG. 6 is a graph showing separation occurrence rate of the solder with respect to a gap of a solder resist at a place sandwiching the solder.

Further, FIG. 6 shows the separation occurrence rate of the solder versus the gap of the solder resist at the place sandwiching the solder. Note that, the thickness of the solder resist was 10 µm, and thus, the gap of the solder resist at the place sandwiching the solder was smaller by 20 µm than the gap between the electrode pad of the semiconductor package and the electrode pad of the printed wiring board.

As shown in FIG. 6, as the gap of the solder resist at the place sandwiching the solder becomes smaller, the separation occurrence rate of the solder becomes higher. Further, when the gap of the solder resist at the place sandwiching the solder is 90 µm (electrode pad interval is 110 µm) or more, separation of the solder does not occur.

As illustrated in FIGS. 4A to 4C, the movement of the molten solder has the effect of forcing out a void that is caused. The effect of inhibiting a void was confirmed as in the following with regard to various kinds of the plurality of electrode pads of the printed wiring board 2 including the first region 5, the second region 6, and the third region 7.

Example 1

A semiconductor package to which the present invention was applied as Example 1 has a land grid array (LGA) structure and has outer dimensions of 10 mm×10 mm. There were four kinds of diameters of the electrode pad: 0.85 mm; 0.6 mm; 0.4 mm; and 0.25 mm. Connection pitches of the electrode pads were 1.7 mm, 1.2 mm, 0.8 mm, and 0.5 mm, respectively. The number of the electrode pads provided was 25, 49, 121, and 289, respectively. Note that, the outer edge portions of the electrode pads were covered with the solder resist.

As a method of mounting the semiconductor package on a printed wiring board formed of a glass epoxy material, the method of manufacturing the printed circuit board illustrated in FIG. 2A to FIG. 2G was used.

The printed wiring board had outer dimensions of 50 mm×50 mm and a thickness of 0.8 mm. Four kinds of the printed wiring board were prepared correspondingly to the kinds of the semiconductor package. As illustrated in FIGS. 3A and 3B, the first regions 5, the second regions 6, and the third regions 7 were formed on the surface of the printed wiring board 2.

The second region 6 was the region of the surface of the electrode pad that was not covered with the solder resist 11, and was formed of copper as the place to be connected with the solder. The copper had a thickness of 20 µm.

The first region 5 was the region in the outer edge portion of the electrode pad 4 that was covered with the solder resist 11. The region had a width of 15 µm to 30 µm. With regard to the thickness, the first region 5 had a total thickness of the thickness of the electrode pad 4 of 20 µm and the thickness of the solder resist 11 of 20 µm, and thus, had the largest height on the surface of the printed wiring board.

The third region 7 was the outer peripheral region adjacent to the second region 6, which was not covered with the solder resist 11. The region was formed so as to have an area that was 95% of the area of the second region 6. Further, as illustrated in FIG. 3A, the direction in which the third region 7 was formed was the same with regard to all the electrode pads 4, and was a diagonal direction in which a gap between adjacent electrode pads was the largest.

As the metal mask, stainless steel having a thickness of 130 µm with openings formed therein by laser processing was used. Note that, the used solder paste 8 had a solder composition of Sn-3.0Ag-0.5Cu, an average solder particle diameter of 20 µm, and a flux content of 12%. Note that, solder paste having a solder composition of Sn—Ag—Cu, Sn—Bi, Sn—Zn, Sn—Cu, or Sn—Pb may also be used.

With regard to conditions of the screen printing illustrated in FIGS. 2A to 2C, the speed of moving the squeegee 42 was set to be 15 mm/s to 50 mm/s. Further, the speed of separating the metal mask 40 and the printed wiring board 2 from each other in FIG. 2D was set to be 1 mm/s to 3 mm/s. In the step described above, the solder paste 8 was supplied in the region of the printed wiring board 2 that was not covered with the solder resist 11 so as to extend both in the second region 6 and in the third region 7. As an amount of offset of the supplied position from the second region 6 that is the electrode pad 4 becomes larger, the effect of reducing a void becomes greater. Further, the solder paste 8 is not applied onto the solder resist 11, and thus, the molten solder agglomerates without being separated.

In order to verify this effect, the supply position of the solder paste was changed so that the ratio of the area of the region in which the solder could move to the area of the second region was 15%, 20%, 25%, 35%, and 95%, to thereby evaluate the effect of reducing a void. Note that, the second region is the region of the surface of the electrode pad, which is not covered with the solder resist, and the region in which the solder can move is the region on the surface of the electrode pad, which is not covered with the solder resist and the solder paste. Further, the areas described above in the verification experiment was able to be measured by, under a state in which the solder paste was printed on the printed wiring board, storing an image taken from above with a microscope and by processing the image.

Figure 2G:
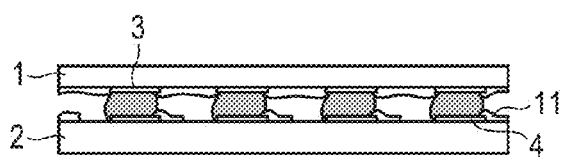

Then, as illustrated in FIG. 2E, the semiconductor package 1 was mounted on the printed wiring board 2 under a state in which the electrode pads 3 of the semiconductor package 1 were aligned with the opposing electrode pads 4 of the printed wiring board 2, respectively. Finally, as illustrated in FIG. 2F and FIG. 2G, the printed wiring board 2 having the semiconductor package 1 mounted thereon was heated in a reflow furnace to melt the solder paste 8, to thereby manufacture the printed circuit board.

After the joining was carried out using the method of manufacturing the printed circuit board described above, the area of voids caused in the solder junction was confirmed with an X-ray transmission apparatus. In an image for observation using the X-ray transmission apparatus, darkness of a displayed color depends on X-ray transmittance of the sample itself. The solder is displayed as dark, and voids are displayed as bright. The areas of the solder and the voids were measured after the image was binarized to clarify a boundary between a dark color and a bright color.

Figure 7:
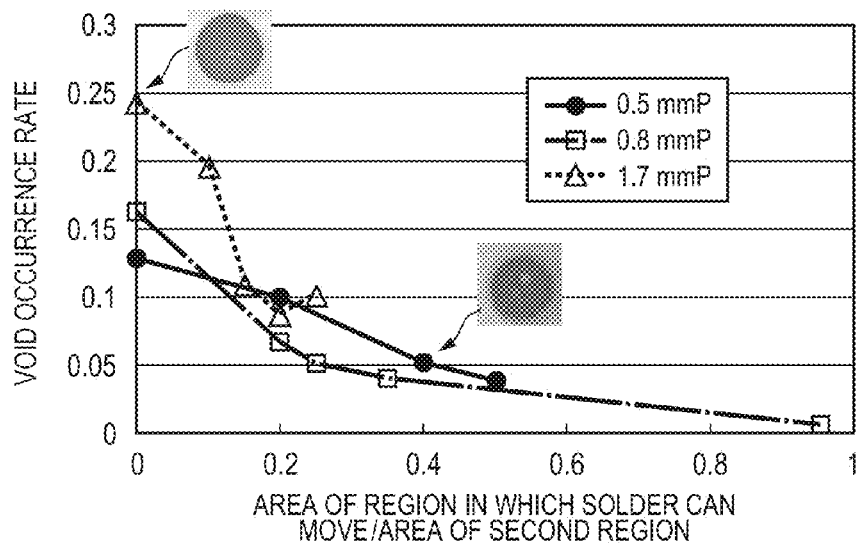
FIG. 7A is a graph showing change in void occurrence rate with respect to a movement amount of molten solder.
FIG. 7B shows X-ray transmission images for observation of void areas.

FIG. 7A is a graph showing change in ratio of the sectional area of voids caused (void occurrence rate) with respect to a relative position between the supplied solder paste 8 and the electrode pad in a reflow heating process. The horizontal axis denotes a ratio of the area of the region in which the solder paste is not supplied (area of the region in which the solder can move) in the second region to the area of the second region as the region of the electrode pad that is not covered with the solder resist. With reference to FIG. 7A, a dotted line and triangles ∆ show results when the connection pitch of the electrode pads was 1.7 mmP, a dot-and-dash line and squares ☐ show results when the connection pitch of the electrode pads was 0.8 mmP, and a solid line and solid circles show results when the connection pitch of the electrode pads was 0.5 mmP. FIG. 7B shows X-ray transmission images for observation of the void areas with regard to the movement amount of the molten solder.

As illustrated in FIG. 7A, it can be confirmed that, when the ratio of the area of the region in which the solder can move to the area of the second region denoted by the vertical axis is 20% or more, the void occurrence rate is greatly lowered. When the ratio of the area of the region in which the solder can move to the area of the second region is 95%, the void occurrence rate is equal to or less than 1%. However, if the position at which the solder paste is printed varies, the solder paste may be unable to be in contact with the electrode pad, which may result in an unjoined state in the heating step. Thus, as the amount of offset of the printed position, 95% or more causes a high risk of a joining failure.

Further, in the printed circuit board manufactured by the manufacturing method described above, the third region on the printed wiring board is surrounded by the solder resist, and thus, the third region has space. By cutting the printed circuit board after the joining and observing the section, it was able to be confirmed that the residual component of the flux accumulated in the space. It is known that, if a residual component of flux extends between electrode pads, an insulation resistance therebetween is lowered. However, the accumulation of the residual component of the flux in the space can inhibit expansion of the residual component of the flux to other regions to inhibit lowered insulating reliability.

Figure 8:
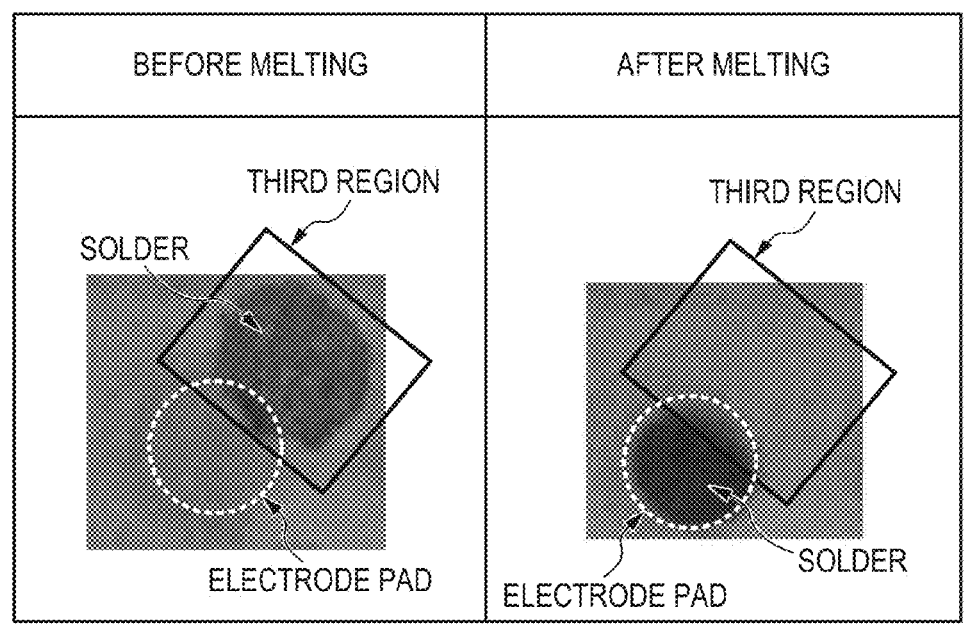
FIG. 8 shows X-ray transmission images for observation of shapes of the solder before and after melting.

FIG. 8 shows X-ray transmission images for observation of shapes of the solder before and after the melting of the samples shown in FIGS. 7A and 7B when the ratio of the area of the region in which the solder paste can move was 95%. As shown in FIG. 8, the solder paste printed so as to be offset from the electrode pad before the melting could agglomerate on the electrode pad without being separated after the melting. Specifically, with regard to a position at which the solder paste was printed, it was found that, when the ratio of the area of the region in which the solder paste could move to the area of the second region was within a range of from 20% or more to 95% or less, the molten solder agglomerated without being separated.

Further, with regard to the supply position of which the solder paste, insofar as the ratio of the area of the region in which the solder paste can move to the area of the second region is within a range of 95% or less, as the amount of offset from the electrode pad becomes larger and the region in which the molten solder moves becomes larger, the effect of reducing a void becomes greater.

Example 2

A semiconductor package to which the present invention was applied as Example 2 has a land grid array (LGA) structure and has outer dimensions of 35 mm×29 mm and a thickness of 2.5 mm. Electrode pads for an electrical signal and reinforcing electrode pads were provided on a lower surface of the semiconductor package.

With regard to the electrode pads for an electrical signal, 256 electrode pads having a pitch of 1.5 mm and a diameter of 1 mm were provided. The reinforcing electrode pads were provided at four corners and four places at midpoints of four sides of the outer periphery of the semiconductor package. The reinforcing electrode pads provided at the corners were triangles having sides of 3.5 mm, the reinforcing electrode pads at the midpoints of longer sides were rectangles of 4 mm×2.5 mm, and the reinforcing electrode pads at the midpoints of shorter sides were rectangles of 2.5 mm×2.5 mm.

Note that, the outer edge portions of the electrode pads for an electrical signal were covered with the solder resist.

Figure 9A:
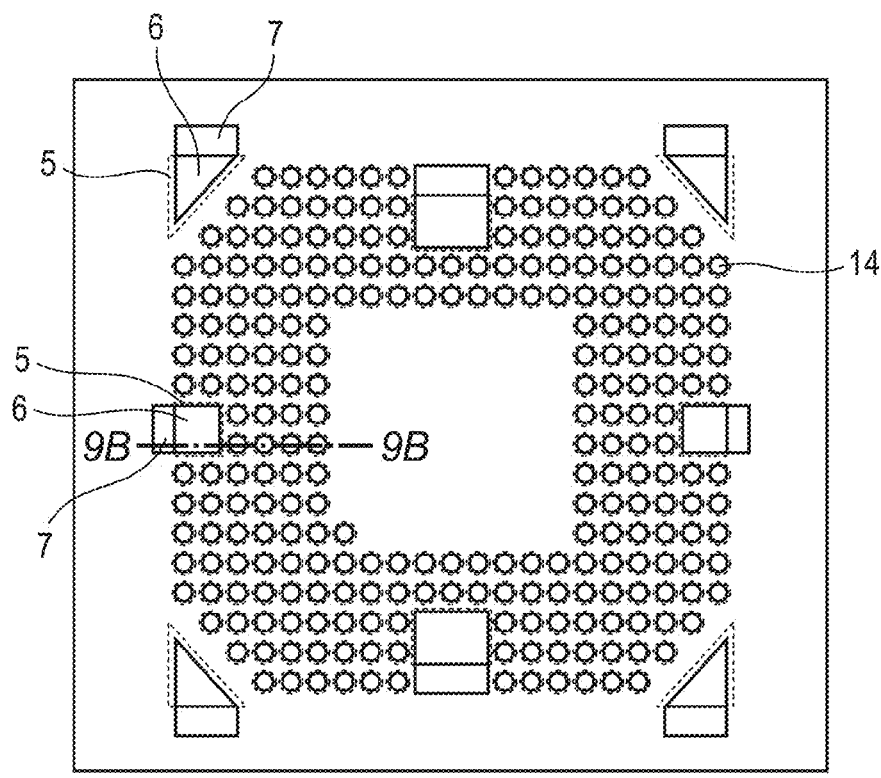
FIG. 9A is a top view illustrating electrode pads of a printed wiring board according to Example 2 of the present invention.
Figure 9B:
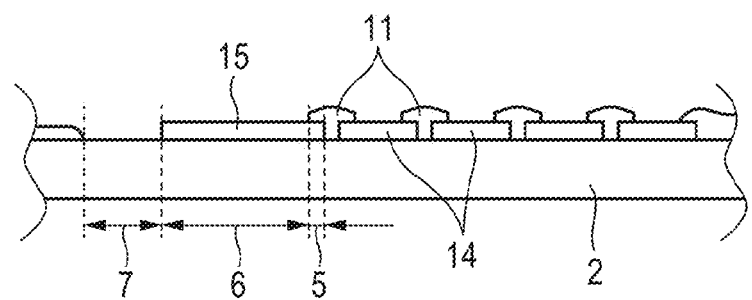
FIG. 9B is a sectional view taken along the line 9B-9B of FIG. 9A.

The printed wiring board was a glass epoxy substrate including eight layers, and had outer dimensions of 50 mm×40 mm and a thickness of 0.8 mm. FIG. 9A is a top view of the printed wiring board, and FIG. 9B is a partial sectional view taken along the line 9B-9B of FIG. 9A. Electrode pads 14 for an electrical signal and reinforcing electrode pads 15 were provided on the printed wiring board 2. 256 electrode pads 14 for an electrical signal having a pitch of 1.5 mm and a diameter of 1 mm were provided. The outer edge portions of the electrode pads 14 were covered with the solder resist 11.

On the other hand, the reinforcing electrode pads 15 were provided at the four corners and the four places at the midpoints of the four sides of the outer periphery of the semiconductor package to be connected. The reinforcing electrode pad 15 had a larger area than that of the electrode pad 14 for an electrical signal.

As illustrated in FIG. 9B, the first region 5, the second region 6, and the third region 7 were formed with regard to the reinforcing electrode pad 15.

The first region was the region in the outer edge portion of the electrode pad 15 that was covered with the solder resist 11. The region had a width of 200 μm. With regard to the thickness, the first region 5 had a total thickness of the thickness of the electrode pad 15 of 30 μm and the thickness of the solder resist 11 of 20 μm, and thus, had the largest height on the surface of the printed wiring board.

The second region 6 was the region of the surface of the electrode pad 15 that was not covered with the solder resist 11, and was formed of copper as the place to be connected with the solder.

The third region 7 was the outer peripheral region adjacent to the second region 6, which was not covered with the solder resist 11. The third region 7 was formed from a side of each reinforcing electrode pad 15 toward the outer periphery of the semiconductor package. The third region 7 was a rectangle of 3.5 mm×1.5 mm at the corners, a rectangle of 4 mm×1.5 mm at the midpoints of the longer sides, and a square of 2.5 mm×1.5 mm at the midpoints of the shorter sides.

A method of manufacturing the printed circuit board of Example 2 is now described with reference to FIGS. 10A to 10E. FIGS. 10A to 10E are sectional views corresponding to FIG. 9B.

Figure 10A:
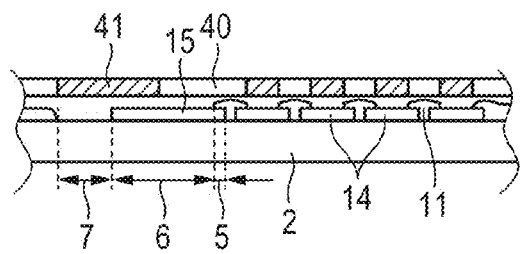
FIGS. 10A, 10B, 10C, 10D and 10E are sectional views illustrating a method of manufacturing a printed circuit board according to Example 2.

As illustrated in FIG. 10A, the electrode pads 14 of the printed wiring board 2 and the openings 41 in the metal mask 40 were aligned, and the printed wiring board 2 and the metal mask 40 were brought into contact with each other.

As the metal mask, stainless steel having a thickness of 300 μm with openings formed therein by laser processing was used. The openings 41 in the metal mask 40 corresponding to the electrode pads 14 for an electrical signal had a diameter of 1 mm, and the positions and the number thereof were the same as those of the electrode pads 14 for an electrical signal.

Further, the openings 41 in the metal mask 40 corresponding to the reinforcing electrode pads 15 had the same shapes as those of the reinforcing electrode pads 15, and the positions thereof were offset from the reinforcing electrode pads 15 toward the corresponding third regions 7. The amount of the offset was 1.5 mm from the corresponding reinforcing electrode pad 15 at the corners, 2.5 mm from the corresponding reinforcing electrode pad 15 at the midpoints of the longer sides, and 2.5 mm from the corresponding reinforcing electrode pad 15 at the midpoints of the shorter sides.

Then, the solder paste supplied onto an end of the metal mask was filled into the openings in the metal mask by moving a squeegee formed of a urethane or a metal to the other end at a speed of 30 mm/s. Then, by separating the metal mask and the printed wiring board from each other at a speed of 3 mm/s, the solder paste was transferred onto the electrode pads of the printed wiring board.

Figure 10B:
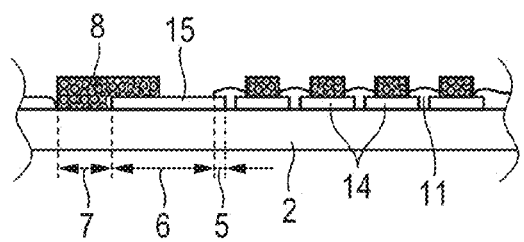

FIG. 10B illustrates the printed wiring board in a state of being supplied with the solder paste.

With regard to the electrode pads 14 for an electrical signal, the solder paste 8 was supplied to the same positions as the electrode pads 14. With regard to the reinforcing electrode pads 15, the solder paste 8 was supplied to a position that extended both in the second region 6 and in the third region 7. Note that, the used solder paste had a solder composition of Sn-58Bi.

Figure 10C:
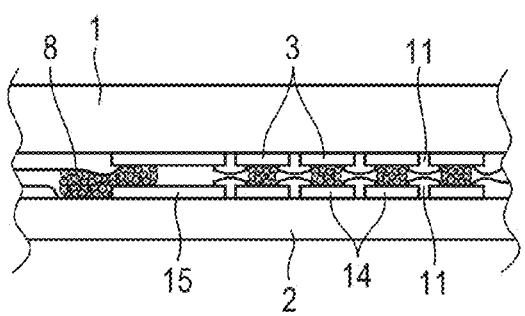

As the next step, as illustrated in FIG. 10C, the semiconductor package 1 was mounted on the printed wiring board 2 under a state in which the electrode pads 3 of the semiconductor package 1 were aligned with the opposing electrode pads 14 of the printed wiring board 2, respectively.

Figure 10D:
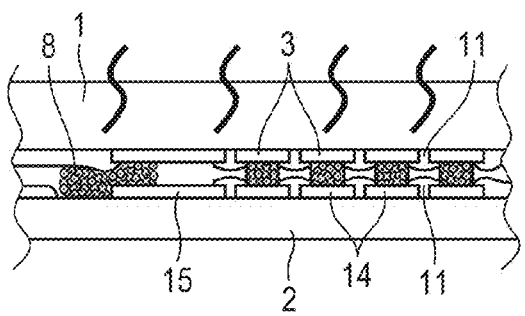

Then, as illustrated in FIG. 10D, the printed wiring board 2 having the semiconductor package 1 mounted thereon was heated in a reflow furnace to melt the solder paste. The temperature was set so that the semiconductor package 1 and the printed wiring board 2 were heated to 139 degrees, which was the melting point of the solder, or higher.

Figure 10E:
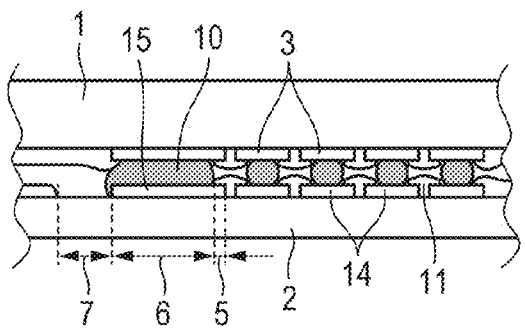

After the molten solder spread on the electrode pads of the semiconductor package and the electrode pads of the printed wiring board, cooling was carried out to solidify the solder, thereby realizing the connected state between the semiconductor package 1 and the printed wiring board 2 as illustrated in FIG. 10E.

With regard to the reinforcing electrode pads, which were joined using the method of manufacturing a printed circuit board described above, whether or not solder separation had occurred was confirmed with an X-ray transmission apparatus. As a result of observation of an image using the X-ray transmission apparatus, it was confirmed that, with regard to all the reinforcing electrode pads, the solder agglomerated without being separated.

Further, the occurrence rate of voids caused in the solder junction (ratio of the area of voids to the area of the electrode pad) was measured with the X-ray transmission apparatus. The image for observation using the X-ray transmission apparatus was binarized to clarify a boundary between a dark color and a bright color, and then the areas of the solder and the voids were calculated. The result was that the void occurrence rate was 3% to 9%. For comparison purposes, with regard to a case in which the method of manufacturing a printed circuit board according to the present invention was not used, that is, a case in which the solder paste was supplied to the same positions as those of the electrode pads, the void occurrence rate was 10% to 30%.

Figure 11:
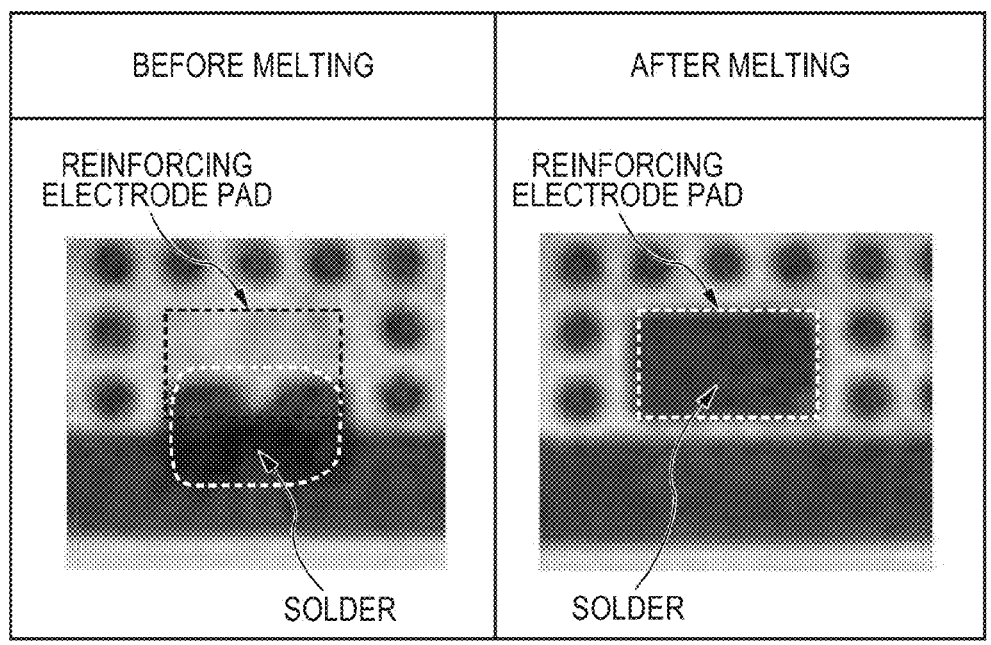
FIG. 11 shows X-ray transmission images for observation of shapes of solder before and after melting according to the Example 2.
Figure 12A:
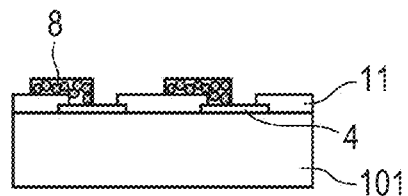
FIGS. 12A, 12B, 12C and 12D are sectional views illustrating a related-art mounting method with regard to reduction of a void.
Figure 12B:
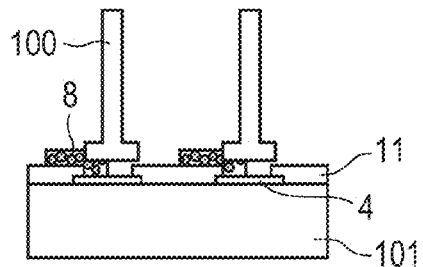
Figure 12C:
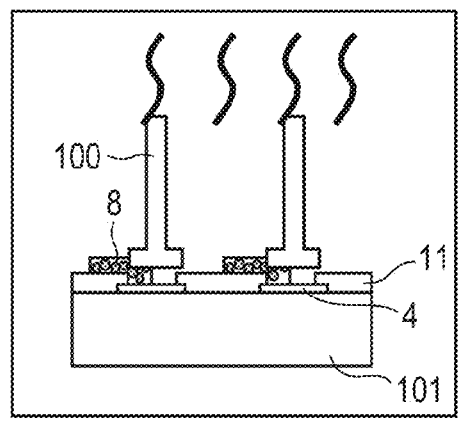
Figure 12D:
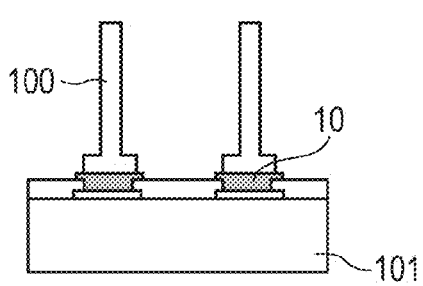

FIG. 11 shows X-ray transmission images for observation of shapes of the solder before and after the melting with regard to the reinforcing electrode pad provided at a midpoint of the longer side of the semiconductor package. As illustrated in FIG. 11, the solder that was printed so as to be offset from the electrode pad before the melting agglomerates on the electrode pad after the melting without being separated. Further, almost no void was caused in the solder after the melting.

As a measure for enhancing the joining strength, a large-sized reinforcing joining pad is usually provided, but there is a problem in that, as the area to be joined becomes larger, a void caused in the solder junction becomes larger, and the joining reliability is more greatly varied. By using the method of manufacturing a printed circuit board according to the present invention, a void in the reinforcing electrode pads can be reduced to secure joining reliability with stability.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-260254, filed Dec. 17, 2013, which is hereby incorporated by reference herein in its entirety.

What is claimed is:

1. A method of manufacturing a printed circuit board,
the printed circuit board comprising: a first printed wiring board comprising a first electrode pad formed on a surface thereof; and a second printed wiring board comprising a second electrode pad formed on a surface thereof, the first electrode pad and the second electrode pad being joined with solder,
the method comprising:
forming, on the second printed wiring board:
a first region in an outer edge portion of the second electrode pad, which is covered with solder resist;
a second region on the second electrode pad wherein the outer edge portion of the second electrode pad is covered with the solder but is not covered with the solder resist; and
a third region which is adjacent to the second region and on the second printed wiring board wherein the third region is not covered with the solder resist but a periphery of the third region is surrounded by the solder resist; and
joining the first electrode pad and the second electrode pad to each other by:
supplying solder paste onto a region extending over the second region and the third region;
mounting the first printed wiring board on the second printed wiring board so that the first electrode pad of the first printed wiring board is opposed to the second electrode pad of the second printed wiring board;
heating the solder paste to be molten; and
causing the molten solder to move from the third region toward the second region.

2. The method of manufacturing a printed circuit board according to claim 1, wherein the first printed wiring board comprises a semiconductor package.

3. The method of manufacturing a printed circuit board according to claim 1, wherein the outer edge portion of the first electrode pad of the first printed wiring board is covered with the solder resist.

4. The method of manufacturing a printed circuit board according to claim 1, wherein a ratio of an area of a region to which the solder paste is not supplied in the second region to an area of the second region is 20% or more to 95% or less.

5. A printed circuit board comprising:
a first printed wiring board comprising a first electrode pad formed on a surface thereof; and
a second printed wiring board comprising a second electrode pad formed on a surface thereof,
the first electrode pad and the second electrode pad being joined with solder,
wherein the second printed wiring board comprises:
a first region in an outer edge portion of the second electrode pad, which is covered with solder resist;
a second region on the second electrode pad wherein the outer edge portion of the second electrode pad is covered with the solder but is not covered with the solder resist; and
a third region which is adjacent to the second region and on the second printed wiring board wherein the third region is not covered with the solder resist but a periphery of the third region is surrounded by the solder resist.

6. The printed circuit board according to claim 5, wherein the first printed wiring board comprises a semiconductor package.

7. The printed circuit board according to claim 5,
wherein the outer edge portion of the first electrode pad of the first printed wiring board is covered with the solder resist, and
wherein a gap between the first electrode pad and the second electrode pad is 20 μm or more to 110 μm or less.

8. The printed circuit board according to claim 5,
wherein the second printed wiring board comprises a plurality of the second electrode pads formed thereon, and
wherein the second region and the third region that are formed correspondingly to each of the plurality of the second electrode pads are formed in the same direction with respect to the corresponding plurality of the second electrode pads, respectively.

9. A printed circuit board comprising:
a first printed wiring board comprising a plurality of first electrode pads formed on a surface thereof; and
a second printed wiring board comprising a plurality of second electrode pads formed on a surface thereof, the plurality of first electrode pads and the plurality of second electrode pads being joined with solder, respectively,
wherein the plurality of first electrode pads comprise an electrode pad for an electrical signal and a reinforcing electrode pad formed in an outer peripheral region of the electrode pad for an electrical signal, and the plurality of second electrode pads comprise an electrode pad for an electrical signal and a reinforcing electrode pad formed in an outer peripheral region of the electrode pad for an electrical signal, and
wherein the reinforcing electrode pad of the plurality of second electrode pads comprises:
a first region in an outer edge portion of the reinforcing electrode pad, which is covered with solder resist;
a second region on the reinforcing electrode pad, which is prevented from being covered with the solder resist; and
a third region in an outer peripheral region of the reinforcing electrode pad adjacent to the second region, which is prevented from being covered with the solder resist.

10. The printed circuit board according to claim 9, wherein an area of the reinforcing electrode pad is larger than an area of the electrode pad for an electrical signal.

* * * * *